(12) United States Patent
Nakajima et al.

(10) Patent No.: US 11,803,017 B2
(45) Date of Patent: Oct. 31, 2023

(54) LIGHT RECEIVING DEVICE AND METHOD OF MANUFACTURING THE SAME

(71) Applicant: Nippon Telegraph and Telephone Corporation, Tokyo (JP)

(72) Inventors: Fumito Nakajima, Tokyo (JP); Yuki Yamada, Tokyo (JP); Masahiro Nada, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 133 days.

(21) Appl. No.: 15/734,601

(22) PCT Filed: May 20, 2019

(86) PCT No.: PCT/JP2019/019894
§ 371 (c)(1),
(2) Date: Dec. 3, 2020

(87) PCT Pub. No.: WO2019/235199
PCT Pub. Date: Dec. 12, 2019

(65) Prior Publication Data
US 2021/0157070 A1 May 27, 2021

(30) Foreign Application Priority Data
Jun. 8, 2018 (JP) .................................. 2018-110045

(51) Int. Cl.
*G02B 6/42* (2006.01)
(52) U.S. Cl.
CPC ........... *G02B 6/4214* (2013.01); *G02B 6/423* (2013.01)
(58) Field of Classification Search
CPC .................................. G02B 6/423; G02B 6/00
(Continued)

(56) References Cited

U.S. PATENT DOCUMENTS 6,027,255 A * 2/2000 Joo ..................... G02B 6/4212
398/1
2003/0072521 A1* 4/2003 Mukai .................. G02F 1/2257
385/24
(Continued)

FOREIGN PATENT DOCUMENTS

JP     H1140823 A * 2/1999
JP     2011248362 A * 12/2011 ........... G02B 6/4214
(Continued)

OTHER PUBLICATIONS

Xia, et al., "Monolithic Integration of a Semiconductor Optical Amplifier and a High Bandwidth p-i-n Photodiode Using Asymmetric Twin-Waveguide Technology," IEEE Photonics Technology Letters, vol. 15, No. 3, Mar. 2003, pp. 452-454.

*Primary Examiner* — Kaveh C Kianni
(74) *Attorney, Agent, or Firm* — Slater Matsil, LLP

(57) ABSTRACT

A light receiving device includes a semiconductor optical amplifier formed on a principal surface of a first substrate. The semiconductor optical amplifier has a first reflection portion that is formed by an end face at one end thereof, the end face being formed to be oblique to the principal surface of the first substrate. The semiconductor optical amplifier also has a second reflection portion that is formed by an end face at the other end thereof, the end face being formed to be oblique to the principal surface of the first substrate. The light receiving device further includes a second substrate having a back surface bonded to a back surface of the first substrate, and a photodiode formed on a principal surface of the second substrate.

10 Claims, 2 Drawing Sheets

(58) Field of Classification Search
USPC .......................................................... 385/14
See application file for complete search history.

(56) References Cited

U.S. PATENT DOCUMENTS

| | | | | |
|---|---|---|---|---|
| 2003/0179974 | A1* | 9/2003 | Estes | ........................ G02F 1/017 |
| | | | | 385/2 |
| 2003/0206708 | A1* | 11/2003 | Estes | ..................... G02B 6/1226 |
| | | | | 385/37 |
| 2008/0266638 | A1* | 10/2008 | Shinoda | ................ G02B 6/4246 |
| | | | | 372/99 |
| 2010/0265983 | A1* | 10/2010 | Adachi | ..................... H01S 5/18 |
| | | | | 372/50.23 |
| 2011/0286694 | A1* | 11/2011 | Wu | ........................ G02B 6/4214 |
| | | | | 385/14 |
| 2012/0183009 | A1* | 7/2012 | Adachi | ..................... H01S 5/18 |
| | | | | 438/31 |
| 2013/0343697 | A1* | 12/2013 | Ishibashi | ............. G02B 6/4214 |
| | | | | 385/14 |

FOREIGN PATENT DOCUMENTS

| | | | | | |
|---|---|---|---|---|---|
| JP | 2013228467 | A | * | 11/2013 | |
| KR | 20050075355 | A | * | 7/2005 | |
| WO | WO-2011065517 | A1 | * | 6/2011 | ................ H01S 5/18 |
| WO | WO-2013179522 | A1 | * | 12/2013 | ............. B32B 37/06 |

* cited by examiner

LIGHT RECEIVING DEVICE AND METHOD OF MANUFACTURING THE SAME

CROSS-REFERENCE TO RELATED APPLICATIONS

This application is a national phase entry of PCT Application No. PCT/JP2019/019894, filed on May 20, 2019, which claims priority to Japanese Application No. 2018-110045, filed on Jun. 8, 2018, which applications are hereby incorporated herein by reference.

TECHNICAL FIELD

The present invention relates to a light receiving device including a photodiode and a semiconductor optical amplifier, and a method of manufacturing the same.

BACKGROUND

In recent years, as the communication capacity of data centers or the like is increasing, there is a demand for increased speed of a photodiode (PD), which is a photoelectric conversion element incorporated in a receiver. As an approach to increase the speed, there is a technique of reducing the thickness of the absorption layer and thereby reducing the time of travel of carriers generated by reception of light. However, this technique leads to a decrease in light receiving sensitivity because the thickness of the absorption layers is reduced. In this way, there is a trade-off relationship between the increase in speed and the light receiving sensitivity.

As described above, it is difficult for a photodiode to achieve a high speed and a high light receiving sensitivity at the same time by itself. However, there is a technique of improving the light receiving sensitivity while ensuring a high speed by integrating a photodiode with a semiconductor optical amplifier (see Non-Patent Literature 1).

According to the technique, a semiconductor optical amplifier and a photodiode are formed on a principal surface of a substrate made of InP. In this technique, on the InP substrate, compound semiconductor layers to form the semiconductor optical amplifier are first formed by crystal growth, and compound semiconductor layers to form the photodiode are then formed by crystal growth. These compound semiconductor layers formed by crystal growth are then patterned into a predetermined shape, thereby forming a light receiving device including a waveguide semiconductor optical amplifier and a photodiode (see FIG. 1 of Non-Patent Literature 1).

With this light receiving device, as shown in FIG. 3, light enters from an input end 203 of a semiconductor optical amplifier 202 formed on a substrate 201, and the incident light is amplified by the semiconductor optical amplifier 202 and is output from an outgoing end 204. The amplified light exiting the outgoing end 204 is guided by an optical waveguide 205 and enters into a photodiode 206.

Unlike the photodiode that receives light only by itself, the light receiving device described above can take advantage of the amplification effect of the semiconductor optical amplifier and therefore can maintain a high light receiving sensitivity as the whole light receiving device even if the thickness of the absorption layer of the photodiode is reduced in order to increase speed. According to Non-Patent Literature 1, the semiconductor optical amplifier achieves an optical amplification of about 8 dB when the driving current is 170 mA.

CITATION LIST

Non-Patent Literature

Non-Patent Literature 1: F. Xia et al., "Monolithic Integration of a Semiconductor Optical Amplifier and a High Bandwidth p-i-n Photodiode Using Asymmetric Twin-Waveguide Technology", IEEE Photonics Technology Letters, vol. 15, no. 3, pp. 452-454, 2003.

SUMMARY

Technical Problem

However, the technique described above has a problem of high manufacturing cost. As described above, the compound semiconductor layers to form the semiconductor optical amplifier are formed by crystal growth, and the compound semiconductor layers to form the photodiode are formed by crystal growth. However, the compound semiconductor layers to form the semiconductor optical amplifier and the compound semiconductor layers to form the photodiode are significantly different in manufacturing conditions, such as those concerning the crystal growth. Therefore, the manufacturing cost is high from the viewpoint of yield, such as evenness of the substrate surface.

Embodiments of the present invention have been devised to solve the problem described above, and an object of embodiments of the present invention is to inhibit an increase of the manufacturing cost of a light receiving device including a photodiode and a semiconductor optical amplifier.

Means for Solving the Problem

A light receiving device according to embodiments of the present invention includes: a waveguide semiconductor optical amplifier that is formed on a principal surface of a first substrate and guides a wave in a direction parallel to the principal surface; a first reflection portion formed by an end face at one end of the semiconductor optical amplifier, the end face being formed to be oblique to the principal surface of the first substrate such that input light that is input to a back surface of the first substrate is to be input; a second reflection portion from which output light is to be output toward the back surface of the first substrate, the second reflection portion being formed by an end face at another end of the semiconductor optical amplifier, and the end face being formed to be oblique to the principal surface of the first substrate; a second substrate having a back surface bonded to the back surface of the first substrate; and a planar photodiode formed on a principal surface of the second substrate at a location where the photodiode is capable of receiving the output light output from the second reflection portion.

The light receiving device described above may further include: a first condenser lens formed on the back surface of the first substrate or the back surface of the second substrate in an optical path of the input light that is input to the first reflection portion; and a second condenser lens formed on the back surface of the first substrate or the back surface of the second substrate in an optical path of the output light that is output from the second reflection portion and input to the photodiode.

A method of manufacturing a light receiving device according to embodiments of the present invention includes: a first step of forming, on a principal surface of a first substrate, a waveguide semiconductor optical amplifier that guides a wave in a direction parallel to the principal surface; a second step of forming a planar photodiode on a principal surface of a second substrate; and a third step of bonding a back surface of the first substrate and a back surface of the second substrate to each other, a first reflection portion is formed by an end face at one end of the semiconductor optical amplifier, the end face being formed to be oblique to the principal surface of the first substrate such that input light that is input to the back surface of the first substrate is to be input, a second reflection portion formed by an end face at the other end of the semiconductor optical amplifier, the end face being formed to be oblique to the principal surface of the first substrate such that output light is to be output toward the back surface of the first substrate, and the photodiode is formed on a principal surface of the second substrate at a location where the photodiode is capable of receiving the output light output from the second reflection portion.

The method of manufacturing a light receiving device described above may further include: a fourth step of forming a first condenser lens on the back surface of the first substrate or the back surface of the second substrate in an optical path of the input light that is input to the first reflection portion; and a fifth step of forming a second condenser lens on the back surface of the first substrate or the back surface of the second substrate in an optical path of the output light that is output from the second reflection portion and input to the photodiode.

Effects of Embodiments of the Invention

Embodiments of the present invention described above have a noticeable effect that an increase of the manufacturing cost of a light receiving device including a photodiode and a semiconductor optical amplifier can be inhibited.

DETAILED DESCRIPTION OF ILLUSTRATIVE EMBODIMENTS

In the following, light receiving devices according to embodiments of the present invention will be described.

First Embodiment

Figure 1:
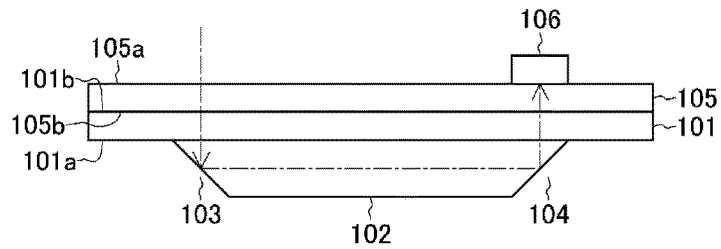
FIG. 1 is a diagram showing a configuration of a light receiving device according to a first embodiment of the present invention.

First, a light receiving device according to a first embodiment of the present invention will be described with reference to FIG. 1. FIG. 1 is a schematic cross-sectional view.

The light receiving device includes a semiconductor optical amplifier 102 formed on a principal surface 101*a* of a first substrate 101. The semiconductor optical amplifier 102 is a well-known waveguide semiconductor optical amplifier and guides light in a direction parallel to the principal surface 101*a*. The semiconductor optical amplifier 102 includes, for example, an n-type InP layer formed on the first substrate 101 made of InP, which is semi-insulating, an active layer as a gain medium made of InGaAsP, and a p-type InP layer formed on the active layer. An electrode is connected to each of the first substrate 101 and the p-type InP layer so that a current can be injected into the active layer.

The semiconductor optical amplifier 102 includes a first reflection portion 103 at one end thereof, and the first reflection portion 103 is formed by an end face of the semiconductor optical amplifier 102 that is oblique to the principal surface 101*a* of the first substrate 101. The first reflection portion 103 allows input light input from the side of a back surface 101*b* of the first substrate 101 to enter.

The semiconductor optical amplifier 102 further includes a second reflection portion 104 at another end thereof, and the second reflection portion 104 is formed by an end face of the semiconductor optical amplifier 102 that is oblique to the principal surface 101*a* of the first substrate 101. Output light amplified by the semiconductor optical amplifier 102 is output from the second reflection portion 104 to the side of the back surface 101*b* of the first substrate 101.

The light receiving device further includes a second substrate 105 bonded to the back surface 101*b* of the first substrate 101 at a back surface 105*b* thereof and a photodiode 106 formed on a principal surface 105*a* of the second substrate 105. The photodiode 106 is a well-known planar (surface-incident) Pin-type photodiode. The photodiode 106 may be an avalanche photodiode. The photodiode 106 is formed at a location where the photodiode 106 can receive the output light from the second reflection portion 104.

Next, a method of manufacturing the light receiving device according to the first embodiment will be described. In this manufacturing method, the waveguide semiconductor optical amplifier 102 that guides a wave in the direction parallel to the principal surface 101*a* is formed on the principal surface 101*a* of the first substrate 101 (a first step). The planar photodiode 106 is formed on the principal surface 105*a* of the second substrate 105 (a second step). The back surface 101*b* of the first substrate 101 and the back surface 105*b* of the second substrate 105 are bonded to each other (a third step).

Alternatively, after the semiconductor layers to form the semiconductor optical amplifier 102 are formed, the semiconductors to form the photodiode 106 are formed, and the substrates are then bonded to each other, each element structure may be formed. Alternatively, the first substrate 101 and the second substrate 105 may be bonded to each other after the element structure of the semiconductor optical amplifier 102 and the element structure of the photodiode 106 are formed.

For example, the first substrate 101 made of semi-insulating InP is prepared, and semiconductor layers to form the semiconductor optical amplifier 102, such as an n-InP layer, an InGaAsP layer and a p-InP layer, are formed on the principal surface 101*a* of the first substrate 101 by epitaxial growth in a well-known organic metal vapor deposition process or the like.

On the other hand, the second substrate 105 made of semi-insulating InP is prepared, and semiconductor layers to form the photodiode 106, such as an n-InP layer, an InGaAs absorption layer and a p-InP layer, are formed on the principal surface 105a of the second substrate 105 by epitaxial growth in an organic metal vapor deposition process or the like.

The first substrate 101 and the second substrate 105 are then each thinned to a predetermined thickness by grinding and polishing, and the back surface 101b of the first substrate 101 and the back surface 105b of the second substrate 105 are bonded to each other. The bonding described above can be achieved by a bonding technique, such as atomic diffusion bonding (ADB) or surface-activated bonding (SAB). Alternatively, the bonding described above may be achieved with an adhesive.

The semiconductor layers formed on the principal surface 101a of the first substrate 101 are then patterned by a well-known photolithography technique or etching technique to form a waveguide structure (see Non-Patent Literature 1). By this patterning, the first reflection portion 103 and the second reflection portion 104 are formed. For example, the waveguide structure formed has one end and another end shaped to be inclined by 45° with respect to the principal surface 101a of the first substrate 101. In order to prevent light that has failed to be absorbed by the photodiode 106 from returning to the semiconductor optical amplifier 102, the angle of inclination of the reflection surface of the second reflection portion 104 may be different from 45° by several degrees.

After the waveguide structure is formed as described above, each electrode is formed in a well-known lift-off process or the like to complete the semiconductor optical amplifier 102.

On the other hand, the semiconductor layers formed on the principal surface 105a of the second substrate 105 are patterned by a well-known photolithography technique or etching technique to form a mesa structure. Each electrode is formed in a well-known lift-off process or the like to complete the photodiode 106.

The photodiode 106 is formed on the principal surface 105a of the second substrate 105 at a location where the photodiode 106 can receive the output light from the second reflection portion 104. In particular, the photodiode 106 is arranged on the principal surface 105a so that the output light from the second reflection portion 104 enters into the center of a light receiving surface of the photodiode 106. The location where the photodiode 106 is arranged depends on the angle of the reflection surface of the second reflection portion 104 and the thicknesses of the first substrate 101 and the second substrate 105.

With the light receiving device according to the first embodiment, light first enters from the side of the principal surface 105a of the second substrate 105 and is transmitted through the second substrate 105 and the first substrate 101 to reach the first reflection portion 103. The light having reached the first reflection portion 103 changes the direction of travel, enters an amplification portion of the semiconductor optical amplifier 102 and is amplified. The amplified light amplified by the semiconductor optical amplifier 102 changes the direction of travel at the second reflection portion 104, is transmitted through the first substrate 101 and the second substrate 105, and is received and converted into electricity by the photodiode 106.

According to the first embodiment, light enters into the substrate in a direction substantially perpendicular to the substrate surface, so that the light receiving device can be easily combined with a planar optical filter or the like. The planar optical filter may be a thin-film filter (TFF) that is an optical DEMUX filter commonly used for a small receiver (ROSA) ready for wavelength division multiplexing (WDM) for optical communication, for example.

Second Embodiment

Next, a light receiving device according to a second embodiment of the present invention will be described with reference to FIGS. 2A, 2B, 2C and 2D. FIGS. 2A, 2B, 2C and 2D are schematic cross-sectional views.

The light receiving device includes a semiconductor optical amplifier 102 formed on a principal surface 101a of a first substrate 101. The light receiving device further includes a second substrate 105 bonded to a back surface 101b of the first substrate 101 at a back surface 105b thereof and a photodiode 106 formed on a principal surface 105a of the second substrate 105. The configuration described so far is the same as the configuration of the light receiving device according to the first embodiment described earlier.

The light receiving device according to the second embodiment includes a first condenser lens 107 formed on the back surface 101b of the first substrate 101 or the back surface 105b of the second substrate 105. The first condenser lens 107 is arranged on an optical path of input light that is input to the first reflection portion 103. The light receiving device further includes a second condenser lens 108 formed on the back surface 101b of the first substrate 101 or the back surface 105b of the second substrate 105. The second condenser lens 108 is arranged on an optical path of output light that is output from the second reflection portion 104 and input to the photodiode 106.

Figure 2A:
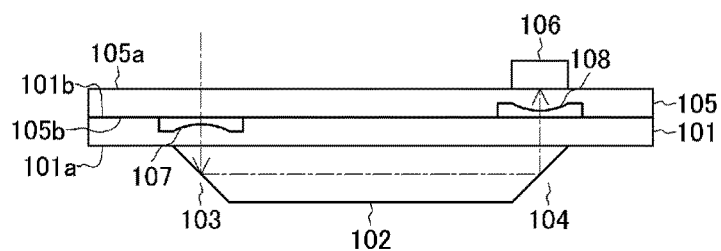
FIG. 2A is a diagram showing a configuration of a light receiving device according to a second embodiment of the present invention.
Figure 2B:
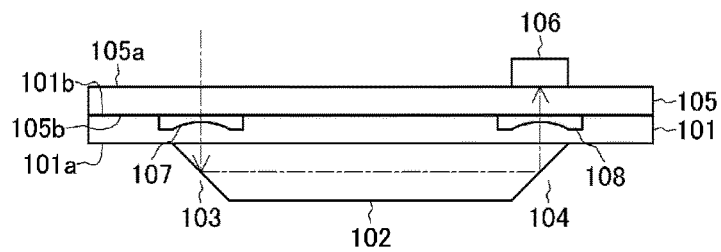
FIG. 2B is a diagram showing another configuration of the light receiving device according to the second embodiment of the present invention.
Figure 2C:
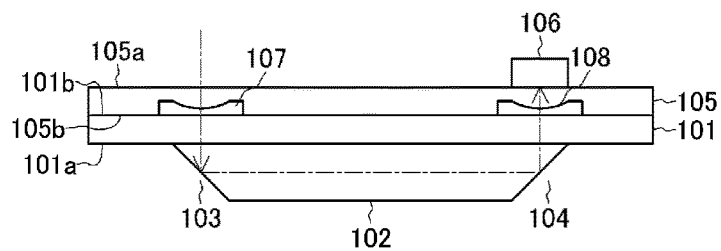
FIG. 2C is a diagram showing another configuration of the light receiving device according to the second embodiment of the present invention.

For example, as shown in FIG. 2A, the first condenser lens 107 can be formed on the back surface 101b of the first substrate 101, and the second condenser lens 108 can be formed on the back surface 105b of the second substrate 105. Alternatively, as shown in FIG. 2B, the first condenser lens 107 and the second condenser lens 108 can be formed on the back surface 101b of the first substrate 101. Alternatively, as shown in FIG. 2C, the first condenser lens 107 and the second condenser lens 108 can be formed on the back surface 105b of the second substrate 105. Forming the first condenser lens 107 and the second condenser lens 108 on one of the substrates allows a plurality of lens structures to be formed at the same time, which leads to a simplification of the process.

Figure 2D:
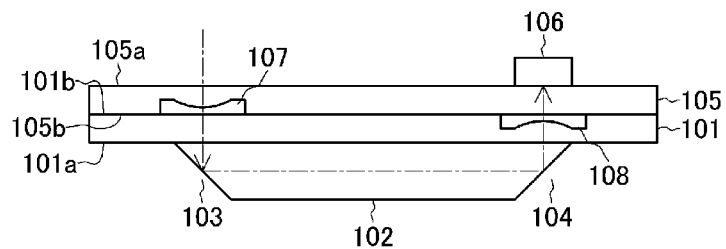
FIG. 2D is a diagram showing another configuration of the light receiving device according to the second embodiment of the present invention.
Figure 3:
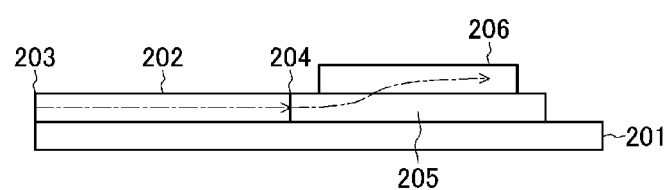
FIG. 3 is a diagram showing a configuration of a conventional light receiving device.

Alternatively, as shown in FIG. 2D, the second condenser lens 108 may be formed on the back surface 101b of the first substrate 101, and the first condenser lens 107 may be formed on the back surface 105b of the second substrate 105.

Next, a method of manufacturing the light receiving device according to the second embodiment will be described. In the second embodiment, in addition to the elements formed in the manufacturing method according to the first embodiment described earlier, the first condenser lens 107 is formed on the back surface 101b of the first substrate 101 or the back surface 105b of the second substrate 105 in such a manner that the first condenser lens 107 is located on the optical path of the input light that is input to the first reflection portion 103 (a fourth step). In addition, the second condenser lens 108 is formed on the back surface 101b of the first substrate 101 or the back surface 105b of the second substrate 105 in such a manner that the second condenser lens 108 is located on the optical path of the output light that is output from the second reflection portion 104 and input to the photodiode 106 (a fifth step).

For example, the first substrate 101 made of semi-insulating InP is prepared, and a first mark for alignment is formed on the principal surface 101a. For example, a first mark made of metal can be formed at a predetermined location in the lift-off process or the like. Semiconductor layers to form the semiconductor optical amplifier 102, such as an n-InP layer, an InGaAsP layer and a p-InP layer, are then formed on the principal surface 101a of the first substrate 101 by epitaxial growth in a well-known organic metal vapor deposition process or the like.

On the other hand, the second substrate 105 made of semi-insulating InP is prepared, and a second mark for alignment is formed on the principal surface 101a. Semiconductor layers to form the photodiode 106, such as an n-InP layer, an InGaAs absorption layer and a p-InP layer, are then formed on the principal surface 105a of the second substrate 105 by epitaxial growth in an organic metal vapor deposition process or the like.

The first substrate 101 and the second substrate 105 are then each thinned to a predetermined thickness by grinding and polishing. The first condenser lens 107 is formed on the back surface 101b of the first substrate 101 in this state. For example, a recess having a convex surface at the bottom thereof is formed in the back surface 101b of the first substrate 101, and the recess serves as the first condenser lens 107. The second condenser lens 108 is formed on the back surface 105b of the second substrate 105 in the same manner. The first condenser lens 107 is formed at a predetermined location with reference to the first mark, and the second condenser lens 108 is formed at a predetermined location with reference to the second mark. Alternatively, the first condenser lens 107 and the second condenser lens 108 may be formed on the back surface of one of the substrates.

After the first condenser lens 107 and the second condenser lens 108 are formed as described above, the back surface 101b of the first substrate 101 and the back surface 105b of the second substrate 105 are bonded to each other. The bonding described above can be achieved by a bonding technique, such as atomic diffusion bonding (ADB) or surface-activated bonding (SAB). Alternatively, the bonding described above may be achieved with an adhesive. In the bonding, it is to be ensured that the first mark and the second mark are in a predetermined positional relationship.

The recess of the first condenser lens 107 and the recess of the second condenser lens 108 may be a space (an air layer) or may be filled with a dielectric, such as silicon oxide. A large difference in index of refraction can be provided between the first substrate 101 and the second substrate 105, which are made of InP, and the air layer or dielectric layer in the recesses described above, and the condenser lens can be provided by the convex surface at the bottom of the recess. Furthermore, in order to prevent a reflection loss of the input light and the output light, an antireflection film designed according to the properties of the material of the recess may be formed on the front surface of the condenser lens and the back surface of the first substrate or second substrate. Furthermore, in order to prevent a reflection loss of the input light, an antireflection film may be formed on the principal surface 105a of the second substrate 105 in a part into which the light enters.

As in the first embodiment described earlier, the semiconductor layers formed on the principal surface 101a of the first substrate 101 are then patterned to form a waveguide structure. By this patterning, the first reflection portion 103 and the second reflection portion 104 are formed. Furthermore, after the waveguide structure is formed as described above, each electrode is formed in a well-known lift-off process or the like to complete the semiconductor optical amplifier 102. In the second embodiment, the semiconductor optical amplifier 102 is formed to be in a predetermined positional relationship with the first mark.

As in the first embodiment described earlier, the semiconductor layers formed on the principal surface 105a of the second substrate 105 are patterned to form a mesa structure. Each electrode is formed in a well-known lift-off process or the like to complete the photodiode 106. In the second embodiment, the photodiode 106 is formed to be in a predetermined positional relationship with the second mark.

By forming the first condenser lens 107, the second condenser lens 108, the semiconductor optical amplifier 102 and the photodiode 106 in such a manner that each of them is in a predetermined positional relationship with the first mark or second mark as described above, the first condenser lens 107 is arranged on the optical path of the input light that is input to the first reflection portion 103. In addition, the photodiode 106 is formed on the principal surface 105a of the second substrate 105 at a location where the photodiode 106 can receive the output light that is output from the second reflection portion 104, and the second condenser lens 108 is arranged on the optical path of the output light.

According to the second embodiment, the first condenser lens 107 and the second condenser lens 108 are provided. These lenses provide advantages that the degree of flexibility in thickness of the first substrate 101 and the second substrate 105 is increased, and the manufacturing margin is improved so that the manufacturing cost is reduced. In addition, since the light is introduced through the first condenser lens 107, the light receiving device according to the second embodiment has an improved packaging tolerance and contributes to a reduction of the cost of the fabrication of a receiver module.

As described above, since the semiconductor optical amplifier and the photodiode are formed on the first substrate and the second substrate, respectively, which are bonded to each other, an increase of the cost of manufacturing the light receiving device including the photodiode and the semiconductor optical amplifier can be inhibited. According to embodiments of the present invention, the semiconductor layers to form the semiconductor optical amplifier and the semiconductor layers to form the photodiode can be separately formed, so that an optical formation (crystal growth) condition for each of the elements can be adopted. In addition, since the light receiving device according to embodiments of the present invention can be of a planar type, which permits vertical incidence of light, the optical coupling tolerance is increased, and the light receiving device can be more easily implemented. In addition, since the first condenser lens and the second condenser lens are provided, the optical coupling tolerance can be further increased.

It is obvious that the present invention is not limited to the embodiments described above, and those of ordinary skill in the art can contemplate many modifications and combinations within the technical concept of the present invention.

REFERENCE SIGNS LIST

101 First Substrate
101a Principal Surface
101b Back Surface
102 Semiconductor Optical Amplifier
103 First Reflection Portion
104 Second Reflection Portion 105 Second Substrate
105a Principal Surface
105b Back Surface
106 Photodiode.

The invention claimed is:

1. A light receiving device, comprising:
a waveguide semiconductor optical amplifier on a first surface of a first substrate that guides an optical wave in a direction parallel to the first surface of the first substrate, the waveguide semiconductor optical amplifier comprising:
  a first reflection portion provided by a first end face at a first end of the waveguide semiconductor optical amplifier, the first end face being oblique to the first surface of the first substrate such that input light input to a second surface of the first substrate is input into the waveguide semiconductor optical amplifier; and
  a second reflection portion provided by a second end face at a second end of the waveguide semiconductor optical amplifier, the second end face being oblique to the first surface of the first substrate such that output light is output toward the second surface of the first substrate;
a second substrate having a third surface and a fourth surface, the fourth surface of the second substrate being bonded to the second surface of the first substrate;
a planar photodiode on the third surface of the second substrate, the planar photodiode configured to receive the output light output from the second reflection portion; and
a condenser lens on the second surface of the first substrate or on the fourth surface of the second substrate in an optical path of the input light that is input to the first reflection portion or in an optical path of the output light output from the second reflection portion.

2. The light receiving device according to claim 1, wherein:
the condenser lens is disposed on the second surface of the first substrate in the optical path of the input light that is input to the first reflection portion.

3. The light receiving device according to claim 1, wherein:
the condenser lens is disposed on the fourth surface of the second substrate in the optical path of the input light that is input to the first reflection portion.

4. The light receiving device according to claim 1, wherein:
the condenser lens is disposed on the second surface of the first substrate in the optical path of the output light that is output from the second reflection portion and input to the planar photodiode.

5. The light receiving device according to claim 1, wherein:
the condenser lens is disposed on the fourth surface of the second substrate in the optical path of the output light that is output from the second reflection portion and input to the planar photodiode.

6. A method of manufacturing a light receiving device, comprising:
a first step of forming, on a first surface of a first substrate, a waveguide semiconductor optical amplifier that guides an optical wave in a direction parallel to the first surface of the first substrate;
a second step of forming a planar photodiode on a third surface of a second substrate; and
a third step of bonding a second surface of the first substrate and a fourth surface of the second substrate to each other;
wherein a first reflection portion is formed by a first end face at a first end of the waveguide semiconductor optical amplifier, the first end face being formed to be oblique to the first surface of the first substrate such that input light input to the second surface of the first substrate is input into the waveguide semiconductor optical amplifier;
wherein a second reflection portion is formed by a second end face at a second end of the waveguide semiconductor optical amplifier, the second end face being formed to be oblique to the first surface of the first substrate such that output light is output toward the second surface of the first substrate;
wherein the planar photodiode is configured to receive the output light output from the second reflection portion; and
wherein the method further comprises a fourth step of forming a condenser lens on the second surface of the first substrate or the fourth surface of the second substrate in an optical path of the input light that is input to the first reflection portion or an optical path of the output light that is output from the second reflection portion.

7. The method of manufacturing a light receiving device according to claim 6, wherein:
the fourth step comprises forming the condenser lens on the second surface of the first substrate in the optical path of the input light that is input to the first reflection portion.

8. The method of manufacturing a light receiving device according to claim 6, wherein:
the fourth step comprises forming the condenser lens on the fourth surface of the second substrate in the optical path of the input light that is input to the first reflection portion.

9. The method of manufacturing a light receiving device according to claim 6, wherein:
the fourth step comprises forming the condenser lens on the second surface of the first substrate in the optical path of the output light that is output from the second reflection portion and input to the planar photodiode.

10. The method of manufacturing a light receiving device according to claim 6, wherein:
the fourth step comprises forming the condenser lens on the fourth surface of the second substrate in the optical path of the output light that is output from the second reflection portion and input to the planar photodiode.

* * * * *